(12) United States Patent
Norton et al.

(10) Patent No.: US 11,132,042 B2
(45) Date of Patent: Sep. 28, 2021

(54) DRIVE CARRIER ASSEMBLIES

(71) Applicant: Hewlett Packard Enterprise Development LP, Houston, TX (US)

(72) Inventors: John Norton, Houston, TX (US); James Jeffery Schulze, Houston, TX (US); Reza M. Bacchus, Spring, TX (US); Robert C. Elliott, Houston, TX (US); Troy Anthony Della Fiora, Spring, TX (US); Keith Sauer, Spring, TX (US); Darrel G. Gaston, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 84 days.

(21) Appl. No.: 15/884,723

(22) Filed: Jan. 31, 2018

(65) Prior Publication Data

US 2019/0235598 A1    Aug. 1, 2019

(51) Int. Cl.
| | | |
|---|---|---|
| *G06F 11/07* | (2006.01) | |
| *G06F 1/30* | (2006.01) | |
| *H05K 7/14* | (2006.01) | |
| *G06F 1/26* | (2006.01) | |
| *G06F 1/28* | (2006.01) | |
| *G06F 1/18* | (2006.01) | |
| *G06F 1/16* | (2006.01) | |
| *G11B 33/12* | (2006.01) | |

(52) U.S. Cl.
CPC ............. *G06F 1/30* (2013.01); *G06F 1/1635* (2013.01); *G06F 1/1658* (2013.01); *G06F 1/187* (2013.01); *G06F 1/188* (2013.01); *G06F 1/263* (2013.01); *G06F 1/28* (2013.01); *H05K 7/1487* (2013.01); *H05K 7/1489* (2013.01); *H05K 7/1492* (2013.01); *H05K 7/1498* (2013.01); *G11B 33/122* (2013.01)

(58) Field of Classification Search
CPC ... G06F 1/30; G06F 1/263; G06F 1/28; G06F 1/32; G06F 1/26
See application file for complete search history.

(56) References Cited

U.S. PATENT DOCUMENTS 5,535,399 A * 7/1996 Blitz ...................... G06F 3/0601
  711/104
5,553,246 A * 9/1996 Suzuki ................ G06F 13/4217
  710/107

(Continued)

FOREIGN PATENT DOCUMENTS

CN        101339800        1/2009

OTHER PUBLICATIONS

IBM System x3200 M2; Feb. 2008; 15 pages.

*Primary Examiner* — Phil K Nguyen
(74) *Attorney, Agent, or Firm* — Hewlett Packard Enterprise Patent Department

(57) ABSTRACT

An example apparatus comprises a drive carrier assembly which may include a memory device, and an energy storage device having at least a portion thereof encased in a housing. In some examples, the apparatus may include a printed circuit assembly to detect a power failure of a host computing device. The printed circuit assembly, may have a first portion coupled to the energy storage device and a second portion coupled to a backplane of the host computing device.

17 Claims, 5 Drawing Sheets

(56) References Cited

U.S. PATENT DOCUMENTS

| | | | |
|---|---|---|---|
| 5,828,823 A * | 10/1998 | Byers | G06F 11/1441 714/24 |
| 6,510,050 B1 | 1/2003 | Lee et al. | |
| 7,161,495 B1 * | 1/2007 | Kilbourne, II | G06F 1/263 340/506 |
| 7,397,671 B2 | 7/2008 | Cleveland et al. | |
| 7,420,802 B2 | 9/2008 | Sone | |
| 7,589,436 B2 | 9/2009 | Takahashi et al. | |
| 8,074,112 B1 * | 12/2011 | Chang | G06F 11/1441 714/14 |
| 9,690,664 B2 | 6/2017 | Ide et al. | |
| 10,660,228 B2 | 5/2020 | Schramm et al. | |
| 2002/0080541 A1 * | 6/2002 | Bunker | G06F 1/184 361/72 |
| 2004/0057203 A1 | 3/2004 | Rabinovitz | |
| 2004/0194154 A1 | 9/2004 | Meadors et al. | |
| 2005/0099766 A1 * | 5/2005 | Fraley | G11B 27/36 361/679.33 |
| 2009/0231798 A1 * | 9/2009 | Skinner | G06F 1/185 361/679.31 |
| 2009/0292887 A1 * | 11/2009 | Manczak | G06F 1/30 711/162 |
| 2010/0271365 A1 * | 10/2010 | Smith | G06T 13/40 345/419 |
| 2013/0007477 A1 * | 1/2013 | Cong | G06F 1/30 713/300 |
| 2014/0331009 A1 * | 11/2014 | Parsonese | G06F 21/80 711/115 |
| 2015/0057964 A1 | 2/2015 | Albinali | |
| 2015/0160706 A1 | 6/2015 | Bhuiyan et al. | |
| 2016/0109920 A1 * | 4/2016 | Massarotti | G06F 1/30 713/300 |
| 2016/0202930 A1 * | 7/2016 | Gordon | G06F 13/1668 711/104 |
| 2017/0063108 A1 * | 3/2017 | Wang | H02J 7/0016 |
| 2017/0140825 A1 * | 5/2017 | Park | G06F 3/0619 |
| 2019/0034669 A1 * | 1/2019 | Lloyd | G06F 21/78 |
| 2019/0157889 A1 * | 5/2019 | Stobbe | H02J 7/0045 |
| 2019/0243568 A1 | 8/2019 | Burns et al. | |

* cited by examiner

DRIVE CARRIER ASSEMBLIES

BACKGROUND

Devices may be connected to a computing device to provide additional memory and energy storage to the computing device. Some devices may be "hot plugged" into the computing device while the computing device is in an operational state.

DETAILED DESCRIPTION

Figure 1:
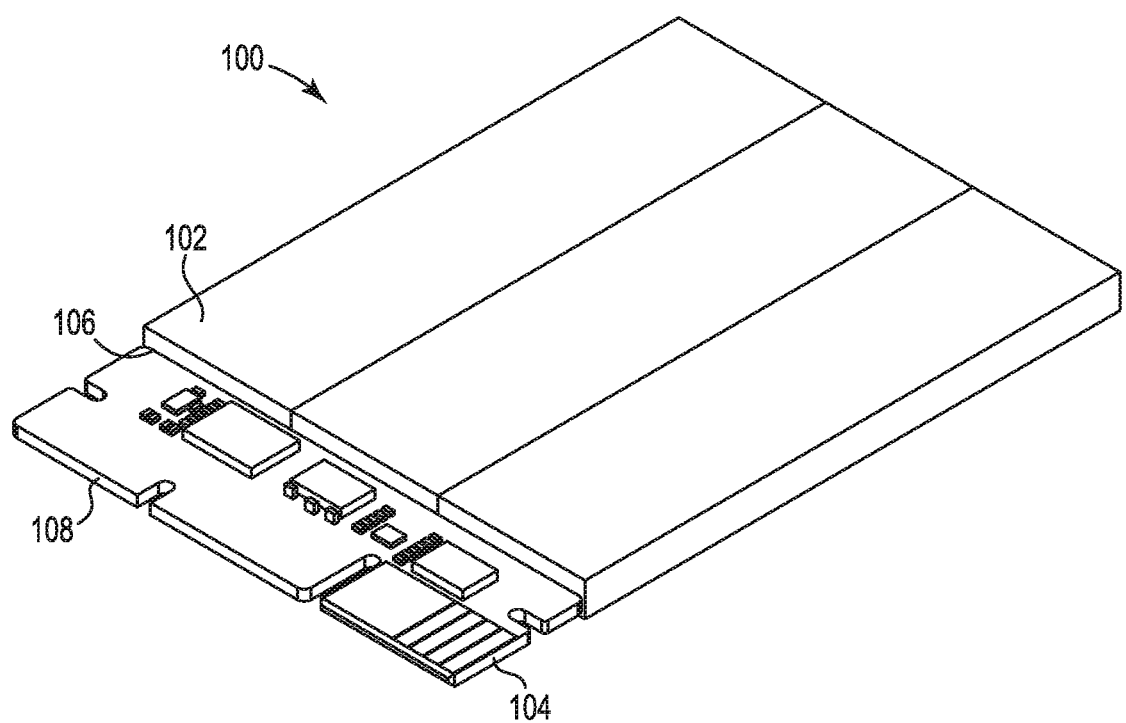
FIG. 1 illustrates an example of an apparatus including an energy storage device consistent with the disclosure.

A device may be connected to a computing device to provide additional memory and energy storage to the computing device. For example, a device such as a drive carrier assembly (DCA), which can include back-up energy devices and/or back-up memory devices and may be connected to a computing device to provide additional energy storage, and/or additional memory, display adapters, audio chipsets, graphics processing units, data storage, and/or memory card readers, among other functionalities to the computing device.

As used herein, a "drive carrier assembly" is a device that may be utilized to co-package auxiliary electronic devices to connect to a computing device. For example, a drive carrier assembly is a structure that is designed to contain electronic devices connected to a computing device (e.g., a host computing device). Examples of drive carrier assemblies include frames, carriers, modified drive bays, and/or chassis to mount docking stations, batteries, and/or other energy storage devices, hard drives and/or other memory devices, etc., which may be inserted into and/or removed from a computing device. For example, the drive carrier assembly may co-package the electronic devices to be connected to a computing device such as a laptop computer, desktop computer, tablet, phablet, convertible laptop, smartphone, server (e.g., blade server), etc.

The drive carrier assembly may co-package multiple devices. As used herein, "co-package" means that one or more devices may be packaged together into one drive carrier assembly (DCA). For example, a DCA may be co-packaged to include two electronic devices such as an energy storage device and a memory device to connect to a host computing device via a drive bay. In the preceding example, the battery and the memory device are co-packaged such that they may connect to the host computing device through individual connectors and/or ports. For example, when the battery and the memory device are co-packaged in the drive carrier assembly and subsequently inserted into a bay of the host computing device, the battery will connect to the computing device through a port (e.g. a first port) and the memory device will connect to the host computing device through a different port (e.g. a second port).

In some approaches, back-up energy cells may be located in internal portions of the computing device and/or in high-temperature areas of the computing device. For example, a blade server may have back-up power that is located internally such that the server may have to be dismantled to service the back-up energy cells thus involving the system to be shut down and/or be powered off. After the shut down/power down, the energy device may be replaced, serviced, and/or installed, and the computing device powered back to an operational state.

In some approaches, back-up energy cells within removable battery devices may not be hot plugged into the computing system (e.g., removable battery devices that may not be connected to the computing system during runtime of the computing system), thus the runtime of the host computing device may be interrupted to replace and/or service a back-up memory device and/or a back-up energy storage device.

In contrast, examples herein may allow for replacement, service, and/or installation of back-up memory device, and/or back-up energy storage device during runtime of the computing device. This may allow for back-up memory, and/or back-up energy storage devices to be hot pluggable devices to be installed, removed and/or serviced without having to reboot or shut down the computing device, which may allow for less computing device downtime, less power consumption due to a reduced number of reboot operations to the computing device, and/or a more streamlined end user computing experience as opposed to some previous approaches.

For example, the back-up memory device and/or back-up energy storage device may be co-packaged in a DCA to be accessible from a front portion of a host computing device. As used herein, "front portion" refers to a portion of the computing device that is reachable to service, install, insert, and/or remove electrical components without having to dismantle the computing device to access said components. For example, the front portion of the host computing device may be an area of the host computing device that is reachable from an externally accessible vantage point. Additionally, in this example, the external accessibility at the front portion of the host computing device may be a low-temperature thermal environment for the co-packaged back-up memory device and/or back-up energy storage device. In some examples, the low-temperature thermal environment may increase efficiency and operability of the back-up memory device and/or back-up energy storage device co-packaged in the drive carrier assembly.

For example, a back-up memory device and/or back-up energy storage device may be co-packaged in a drive carrier assembly to be accessible from the front portion of a host computing device. In this example, the accessibility from the front portion of the host computing device positions the drive carrier assembly in an area of the host computing device that is a low-temperature when compared to the previously mentioned internal portions of the host computing device. In addition, the terms "low-temperature" and "high-temperature" as used herein are intended to describe thermal temperatures of portions of the host computing device relative to a different portion of the host computing device, and should not be taken in a limiting sense.

The figures herein follow a numbering convention in which the first digit corresponds to the drawing figure number and the remaining digits identify an element or component in the drawing. For example, reference numeral 100 may refer to element "00" in FIG. 1 and an analogous element may be identified by reference numeral 200 in FIG. 2. Elements shown in the various figures herein can be added, exchanged, and/or eliminated so as to provide a number of additional examples of the disclosure. In addition, the proportion and the relative scale of the elements provided in the figures are intended to illustrate the examples of the disclosure, and should not be taken in a limiting sense.

FIG. 1 illustrates an example of an apparatus including an energy storage device consistent with the disclosure. The apparatus 100 may include an energy storage device 102, a printed circuit assembly 104 having a first portion 106 and a second portion 108. The energy storage device 102 in some examples may be a battery.

For example, as illustrated in FIG. 1, the energy storage device 102 may be an electric battery. As used herein, the term "battery" may refer to a device used to power, or store energy to power a different electrical or mechanical device. The energy storage device 102 may comprise a plurality of cells and/or capacitors. For example, the plurality of cells may be electrochemical cells with connections to power other electronic devices. As used herein, the term "cell" refer to a battery cell of the plurality of cells within the battery and may be that of a wet cell, a reserve cell, and/or a dry cell, other types of battery cell may be used, and these examples should not be taken in a limiting sense.

The printed circuit assembly 104, of the apparatus 100 is communicatively coupled to the energy storage device 102 by a first portion 106 and may commutatively couple to a port of a host computing device utilizing a second portion 108. As used herein, the term "printed circuit assembly" refers to a device to mechanically support and electronically connect electronic components and/or electric components. In some examples, the printed circuit assembly may be soldered to the components.

For example, the printed circuit assembly 104 may be a circuit board including circuitry to regulate the plurality of cells within the energy storage device 102. In some examples, the printed circuit assembly 104 is connected to a backplane and/or a port of the host computing device by the second portion 108 (discussed further in conjunction with FIG. 5) and connected to the energy storage device 102 by the first portion 106. In some examples the host computing device may be a server. The printed circuit assembly 104 may detect a power failure of the host computing device and regulate the plurality of cells of the energy storage device 102 in response to the detected power failure.

Figure 2:
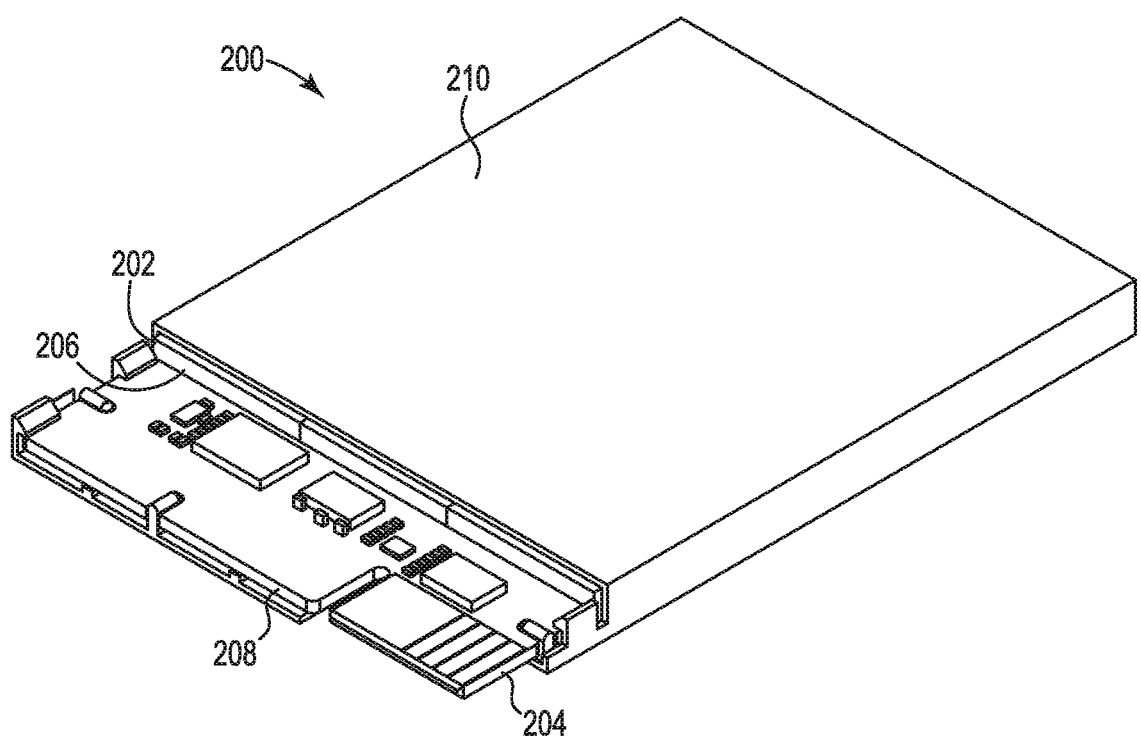
FIG. 2 illustrates yet another example of an apparatus including an energy storage device consistent with the disclosure.

FIG. 2 illustrates yet another example of an apparatus including an energy storage device consistent with the disclosure. The apparatus 200 may include the energy storage device 202, the printed circuit assembly 204 having the first portion 206 and the second portion 208, and a housing 210. The energy storage device 202 in some examples may be a battery where at least a portion of the battery is encased by housing 210.

As shown in FIG. 2, the housing 210, may encase at least a portion of energy storage device 202. The housing 210 may be designed to protect the energy storage device 202 from damage. The housing 210 may be made of various suitable materials. For example, the housing 210 may be made of metal, metal alloys, polymers, thermoplastics, and/or other suitable materials. In some examples, the housing 210 may be substantially of dimensions suitable to encase the energy storage device 202 such that the housing 210 may co-package with a second device into a drive carrier assembly, discussed further in conjunction with FIGS. 3 and 4.

As used herein, the term "substantially" intends that the characteristic is close enough to an ideal characteristic so as to achieve the value of the characteristic. For example, the dimensions of the housing 210 may be different than that of the energy storage device 202, but close enough to allow for the intended function of co-packaging the energy storage device 202 with a second device to be achieved.

As illustrated in FIG. 2, the housing 210 of the apparatus 200 may encase at least a portion of energy storage device 202. As used herein, the term "encase" means a cover to wrap the exterior portion of the electronic storage device 202, the housing 210 may be made of a material intended to protect and/or provide a uniform structure to facilitate the co-packaging of the energy storage device within a DCA, such as DCA 312 illustrated and described in conjunction with FIG. 3.

The housing 210, illustrated in FIG. 2 may also provide an attachment and/or a fastener to couple the energy storage device 202 to a second device. As used herein, a "fastener" is a mechanism to secure an apparatus, device and/or other structure to a different structure. A fastener may be a clip, a pin, a snap or any equivalent mechanism to achieve securely fastening one structure to another structure. For example, the housing 210 may partially encase at least a portion of the energy storage device 202 while the printed circuit assembly 204 remains exposed, and the housing 210 may further couple to the top portion of the DCA to allow space for a second device, such as a memory device, thus co-packaging both devices into a single unit DCA. In some examples, this may allow the second portion 208 to commutatively couple to a backplane of a host computing device.

Figure 3:
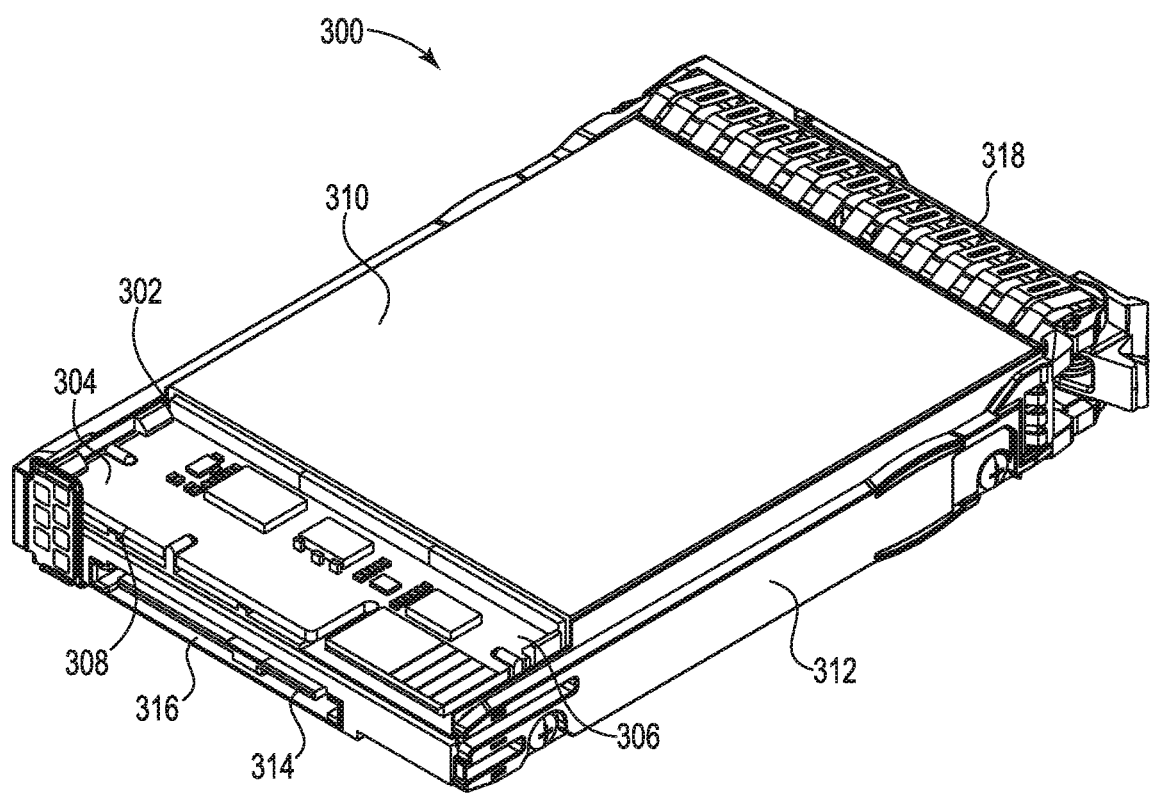
FIG. 3 illustrates example of an apparatus including a memory device co-packaged with an energy storage device consistent with the disclosure.

FIG. 3 illustrates example of an apparatus including a memory device co-packaged with an energy storage device consistent with the disclosure. The apparatus 300 may include the energy storage device 302, the printed circuit assembly 304 having the first portion 306 and the second portion 308, the housing 310, a DCA 312, a memory device 314, a first end of the DCA 316, and a second end of the DCA 318.

The memory device 314 may include volatile memory (e.g., RAM, DRAM, SRAM, EPROM, EEPROM, etc.) and/or non-volatile memory (e.g., a HDD, a storage volume, data storage, etc.) In some examples, the memory device 314 may be used as a back-up memory device in the event of a power loss experienced by the host computing device.

As illustrated in FIG. 3, the memory device 314 co-packages the energy storage device 302 and the housing 310 into the DCA 312 such that the DCA 312 is moveable as a single unit. For example, as discussed further in conjunction with FIG. 5, the energy storage device 302, housing 310, and memory device 314 are co-packaged together into the DCA 312 such that all of the components may be inserted into a bay of a host computing device as a single unit. Continuing with the previous example, the first end of the DCA 316 may facilitate the memory device 314 coupling to a port and/or a backplane of the host computing device and the second portion 308 of the printed circuit assembly to communicatively couple to a separate port and/or backplane of the host computing device.

For example, when a host computing device is communicatively coupled to the DCA 312, and experiences a loss of power, the second portion 308 of the printed circuit assembly 304 may communicate with the energy storage device 302 to regulate a plurality of cells within the energy storage device 302 to power a host computing device and/or memory device 314. Continuing with this example, the host computing device may facilitate the transfer of data stored in volatile memory associated with the host computing device to non-volatile memory associated with the memory device 314 in response to detection of the power loss.

As illustrated in FIG. 3, the memory device 314 co-packages the energy storage device 302 and the housing 310 into the DCA 312. As described herein, the co-packaged DCA 312 may be hot pluggable when inserted into a bay of a host computing when the computing device is in an operational state (e.g. device during runtime of a host computing device.) For example, the co-packaged DCA 312 may be coupled to a backplane of the host computing device while the host computing device is running such that the memory device 314 and the energy storage device 302 are operable without rebooting the computing device. In some examples, the DCA 312 may be connected to the host computing device during runtime of the host computing device, but may not be connected to the host computing device prior to runtime of the host computing device. These features are discussed further in conjunction with FIG. 5.

Figure 4:
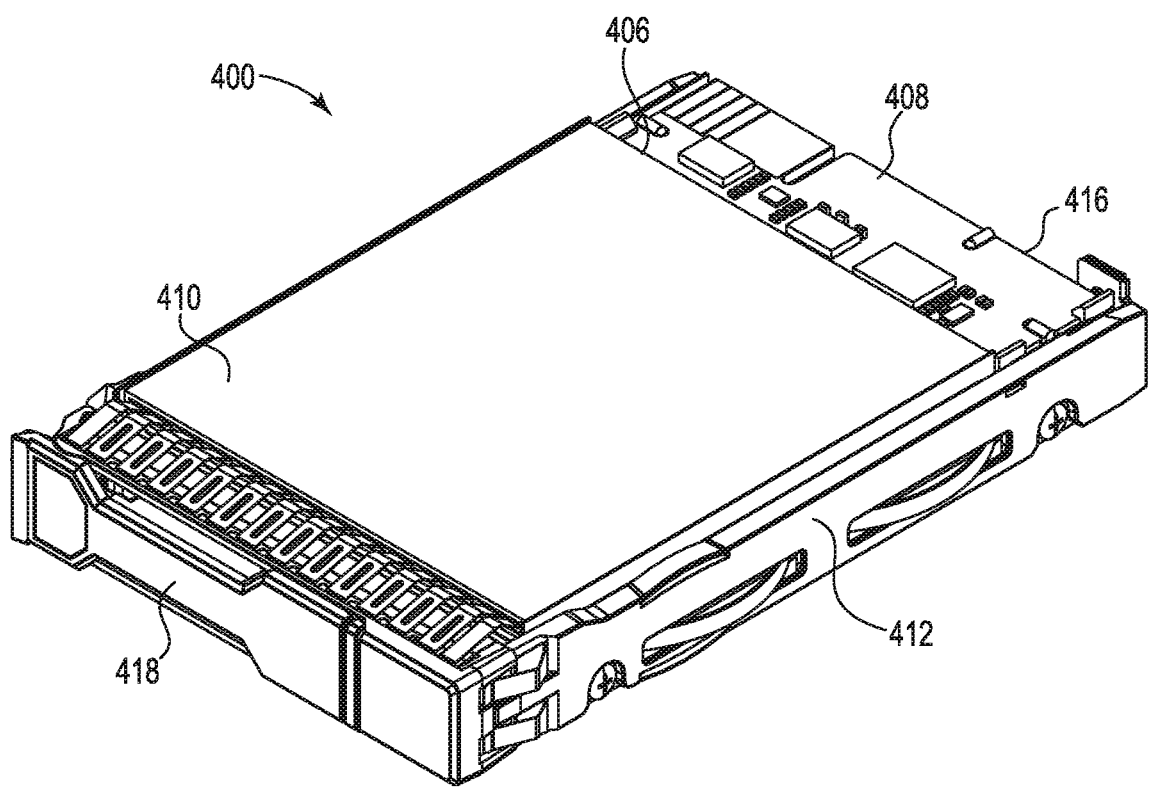
FIG. 4 illustrates yet another example of an apparatus including a printed circuit assembly consistent with the disclosure.

FIG. 4 illustrates yet another example of an apparatus including a printed circuit assembly consistent with the disclosure. The apparatus 400 may include the printed circuit assembly 404 having the first portion 406 and the second portion 408, the housing 410, the DCA 412, the first end of the DCA 416, and the second end of the DCA 418.

In some examples, the second end 418 of the DCA 412 is accessible from a front portion and/or an exterior of the host computing device. For example, a user and/or a machine may wish to install, service, and/or remove the DCA 412 from the host computing device. Continuing with this example, the second end 418 of the DCA 412 may be accessed from the exterior of the host computing device such that the DCA 412 may be installed and/or removed without disassembling the host computing device to gain access to an interior portion.

In some examples, the second end 418 of the DCA 412 may be secured to the host computing device by at least one snap and/or an equivalent removable fastener (not explicitly shown in FIG. 4). For example, a user and/or a machine may couple (e.g. to install the DCA 412) and/or decouple (e.g. to remove the DCA 412) utilizing the at least one snap or fastener. In this example, the user and/or the machine may remove the DCA 412 by removing the at least one snap or equivalent fastener securing the second end 418 of the DCA 412 such that the DCA 412 may be removed from the host computing device. Accordingly, at least one snap and/or fastener may be coupled to the second end 418 of the DCA 412 to install the DCA 412 into the computing device, in the same fashion as the preceding example. In the preceding examples, the installation and removal utilizing the at least one snap and/or fastener may be accomplished without the use of tools.

In some examples, the second end 418 of the DCA 412 may include an indication mechanism. For example, when the first end 416 of the DCA 412 is inserted into the backplane of a host computing device, a mechanism may provide an indication that the second portion 408 of the printed circuit assembly 404 and an energy storage device such as 302 shown in FIG. 3 are communicatively coupled to the backplane. In some examples, the indicator mechanism may be an LED and/or a light (not explicitly shown). For example, the LED and/or light may be illuminated the DCA 412 is coupled to the host computing device and/or is in operation.

In some examples, the second end 418 of the DCA 412 may include one or more fasteners to secure the DCA 412 in place. For example, the DCA 412 may be inserted into a bay of a host computing device during a runtime of a host computing device without interrupting the runtime, once inserted the DCA 412 may be secured in place by at least one fastener (not explicitly shown). The DCA 412 may be removed and/or ejected in this described manner utilizing fasteners coupled to second end 418. For example, DCA 412 may be decoupled from the backplane of a host computing device during runtime of the host computing device without interrupting the runtime.

Figure 5:
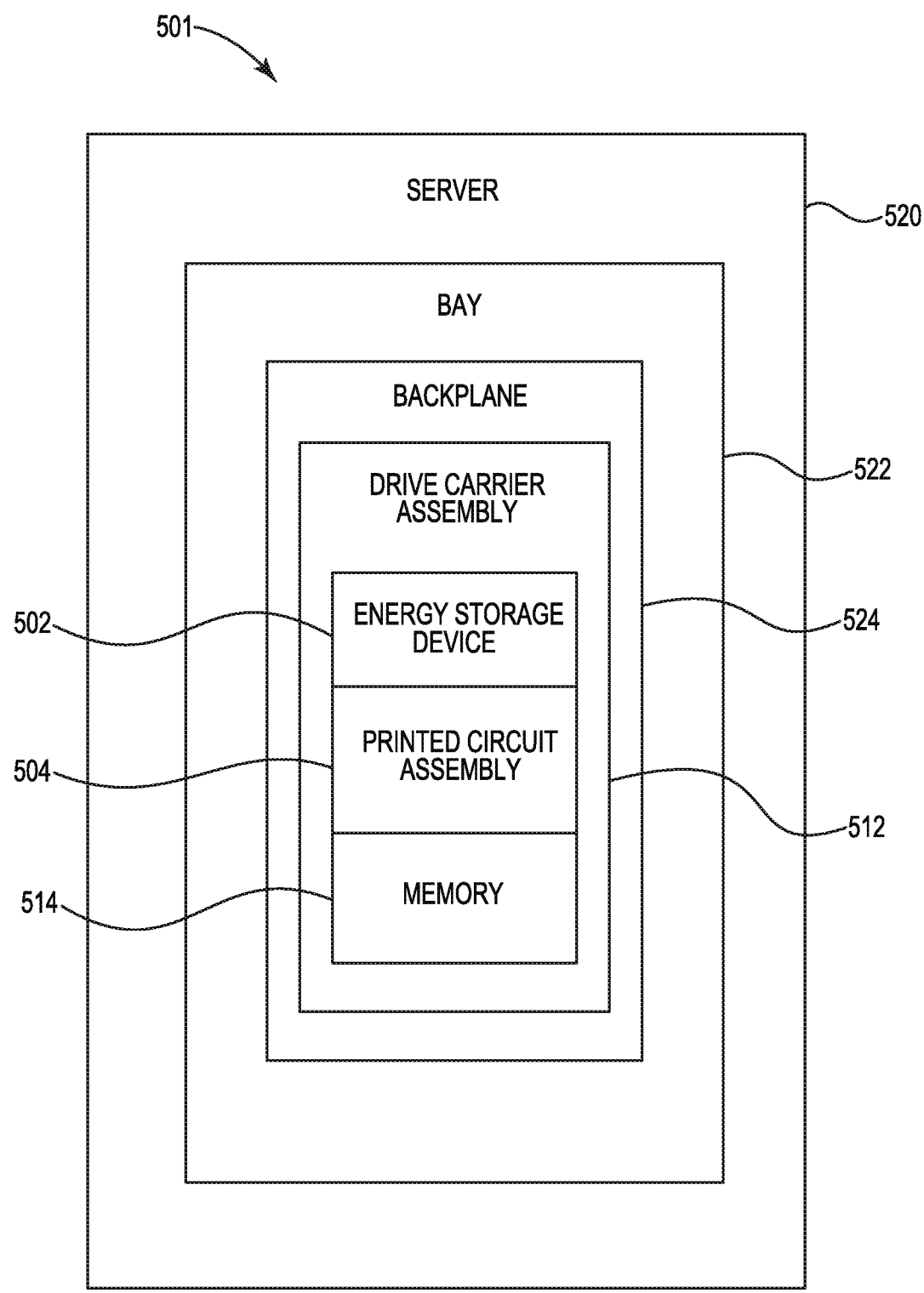
FIG. 5 illustrates an example system including a drive carrier assembly consistent with the disclosure.

FIG. 5 illustrates an example system including a drive carrier assembly consistent with the disclosure. System 501 illustrates a server 520, a bay 522, a backplane 524, the DCA 512, the energy storage device 502, the printed circuit assembly 504, and the memory device 514. In some examples, the server 520 may be a host computing device similar to those described in the preceding examples.

The server 520 includes the bay 522 to receive the DCA 512 and communicatively couple the DCA 512 to the backplane 524 of the server 520. The DCA 512 is co-packaged to include the memory device 514, the energy storage device 502, which may be partially encased by a housing that may be coupled to a portion of the DCA 512, and the printed circuit assembly 504, which may be coupled to the energy storage device 502 to regulate the use of the energy storage device 502 in response to receiving a signal from the server 520 that the system 501 has experienced a power failure.

In some examples, the energy storage device 502 may be co-packaged in the DCA 512 such that the memory device 514 is positioned below the energy storage device 502 relative to the DCA 512 and the bay 522. For example, the co-packaged DCA 512 is inserted into the backplane 524 within the bay 522 such that the memory device 514 and the printed circuit assembly 504 of the energy storage device 502 commutatively couple to separate ports of the backplane 524, and the port that may communicatively couple to the printed circuit assembly 504 of the energy storage device 502 (e.g. a first port) is positioned above a different port (e.g. a second port) that may communicatively couple to the memory device 514.

In some examples, the bay 522 of the server 520 may be located on a front portion of the server 520. For example, the external accessibility at the front portion of the server 520 may be a low-temperature thermal environment for the co-packaged memory device 514 and energy storage device 502 of the DCA 512. In the preceding example the front portion accessibility of the DCA 512 is easily accessible as the server 520 does not involve the server 520 being powered off or dismantled to service the memory device 514, the printed circuit assembly 504, and/or the energy storage device 502.

In some examples, the DCA 512 may be hot-plugged into the bay 522, from an exterior portion of the server 520 while the server is operating. For example, the server 520 may be operating during runtime and the DCA 512 co-packaged with the energy storage device 502, the printed circuit assembly 504, and the memory device 514 may be operational when they are inserted into respective ports of the backplane 524 of server 520. In the preceding example, the server 520 would remain operational during the insertion of the DCA 512 and would not involve powering down and/or interruption of the server 520 runtime.

In some examples the DCA 512 may be decoupled, removed, and/or ejected from the backplane 524 during runtime of the server 520. For example, the server 520 may be operating during runtime and the DCA 512 co-packaged with the energy storage device 502, the printed circuit assembly 504, and the memory device 514, may be removed from respective ports of the backplane 524 of server 520. In the preceding example, the server 520 would remain operational during the decoupling, removal, and/or ejection of the DCA 512 and would not involve powering down and/or interruption of the server 520 runtime.

In some examples, the printed circuit assembly 504 regulates a plurality of cells within the energy storage device 502 in response to a power failure experienced by the server 520. For example, the printed circuit assembly 504 may detect a power failure of server 520, and in response to the detected power failure of the server 520 the printed circuit assembly 504, may regulate the usage of the plurality of cells contained in the energy storage device 502 and instruct the energy storage device 502 to power the memory device 514 and/or the server 520. In some examples, the DCA 512 may facilitate the transfer of data stored in volatile memory associated with the server 520 to non-volatile memory associated with the memory device 514.

In some examples, the server 520 may utilize multiple devices similar to the DCA 512. For example, a server 520 or equivalent host computing device may utilize more than one device similar to the DCA 512 as described herein. In this example, the server 520 may utilize the energy storage devices similar to 502 contained in multiple drive carrier assemblies similar to the DCA 512 to power the server 520 in the event that the server 520 experiences a power loss.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. As used herein, designators such as "N", etc., particularly with respect to reference numerals in the drawings, indicate that a number of the particular feature so designated can be included. A "plurality of" is intended to refer to more than one of such things.

What is claimed:

1. An apparatus comprising:
   a drive carrier assembly (DCA) comprising:
      a printed circuit assembly having a first portion and a second portion;
      an energy storage device coupled to the first portion of the printed circuit assembly;
      a housing partially encasing the energy storage device and the printed circuit assembly;
      a memory device co-packaged with the printed circuit assembly, the housing, and the energy storage device, and comprising a first connector to couple to a backplane of a host computing device;
      a second connector, distinct from the first connector, to couple the second portion of the printed circuit assembly to the backplane;
   wherein the DCA is coupleable to or decoupleable from the backplane during a runtime of the host computing device without interrupting the runtime;
   wherein the printed circuit assembly detects a power failure of the host computing device in response to receiving a signal from the host computing device;
   wherein, after detecting the power failure, the energy storage device is to provides back-up power to the host computing device and wherein the energy storage device is to power the memory device to facilitate a transfer of data stored in volatile memory associated with the host computing device to non-volatile memory associated with the memory device.

2. The apparatus of claim 1, wherein the first connector comprises a plurality of contacts on an exposed end of the memory device to couple to a first port of the backplane.

3. The apparatus of claim 1, wherein the printed circuit assembly comprises circuitry to regulate operation of a plurality of cells within the energy storage device in response to detecting the power failure of the host computing device.

4. The apparatus of claim 1, wherein the second connector comprises a plurality of contacts on an exposed end of the second portion of the printed circuit assembly to couple to a second port of the backplane, wherein the first and second ports are different ports of the backplane.

5. The apparatus of claim 1, wherein the DCA includes a top portion and the housing is coupled to the top portion of the DCA by an attachment or fastener.

6. The apparatus of claim 1, wherein the memory device comprises both volatile and non-volatile memory.

7. The apparatus of claim 1, wherein the DCA is mechanically and electrically interchangeable with a carrier containing a single device.

8. The apparatus of claim 1, wherein the energy storage device comprises a capacitor.

9. A system comprising:
   a bay electrically and communicatively coupled to a server;
   a backplane of the bay comprising a first port and a second port that is distinct from the first port; and
   a drive carrier assembly (DCA) disposed within the bay, the DCA comprising:
      a memory device coupled to the first port;
      an energy storage device comprising a plurality of cells; and
      a printed circuit assembly having a first portion communicatively coupled to the energy storage device and a second portion coupled to the second port,
      wherein the DCA is coupleable to or decoupleable from the backplane during a runtime of the server without interrupting the runtime;
   wherein the printed circuit assembly is to:
   detect a power failure of the server, and
   respond to the power failure by regulating the plurality of cells to provide back-up power to the server and further to provide power to the memory device to facilitate a transfer of data stored in volatile memory associated with the server to non-volatile memory associated with the memory device.

10. The system of claim 9, wherein the bay is accessible from a front portion of the server.

11. The system of claim 9, wherein the DCA is insertable and removeable from the bay as a single unit.

12. The system of claim 9, wherein the DCA further comprises a housing that partially encases the energy storage device and the first portion of the printed circuit board.

13. The system of claim 9, further comprising one or more fasteners, wherein the DCA is secured to the bay by the one or more fasteners.

14. The system of claim 9, wherein the bay has a lower environmental temperature than an interior of the server.

15. A drive carrier assembly comprising:
   a co-packaging structure;
   a memory device disposed within the co-packaging structure and having an exposed end to couple to a first port of a host computing device;

an energy storage device disposed within the co-packaging structure; and
a printed circuit assembly disposed within the co-packaging structure, the printed circuit assembly comprising:
 an exposed portion having an end to couple to a second port of the host computing device, which is distinct from the first port, to receive a signal indicating a power failure of the host computing device; and
 an enclosed portion communicatively coupled to the energy storage device to control the energy storage device in response to receiving the signal indicating the power failure,
wherein:
the memory device is coupleable to or decoupleable from the first port during a runtime of the host computing device without interrupting the runtime;
the exposed portion of the printed circuit assembly is coupleable to or decoupleable from the second port during a runtime of the host computing device without interrupting the runtime;

the energy storage device is to provide back-up power to the host computing device in response to the power failure of the host computing device, and the energy storage device is to provide power to the memory device to facilitate a transfer of data stored in volatile memory associated with the host computing device to non-volatile memory associated with the memory device.

16. The drive carrier assembly of claim 15, wherein the energy storage device is disposed above the memory device inside the DCA.

17. The drive carrier assembly of claim 15, wherein the energy storage device is a battery comprising a plurality of battery cells, and wherein the printed circuit assembly comprises circuitry to detect the power failure of the host computing device, from the signal, and to regulate the plurality of battery cells in response to the detected power failure.

* * * * *